(12) United States Patent
Baek

(10) Patent No.: US 7,524,760 B2
(45) Date of Patent: Apr. 28, 2009

(54) SEMICONDUCTOR DEVICE AND METHOD FOR MANUFACTURING THE SAME

(75) Inventor: In Cheol Baek, Daejeon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 105 days.

(21) Appl. No.: 11/610,899

(22) Filed: Dec. 14, 2006

(65) Prior Publication Data

US 2007/0145593 A1   Jun. 28, 2007

(30) Foreign Application Priority Data

Dec. 26, 2005   (KR) .................. 10-2005-0129865

(51) Int. Cl.
*H01L 21/4763* (2006.01)
(52) U.S. Cl. .................. 438/640; 438/671; 438/673
(58) Field of Classification Search .................. 438/640, 438/671, 673
See application file for complete search history.

(56) References Cited

U.S. PATENT DOCUMENTS

| | | | | |
|---|---|---|---|---|
| 6,280,908 B1 * | 8/2001 | Aviram et al. | ............... | 430/314 |
| 6,577,010 B2 * | 6/2003 | Batra et al. | ................. | 257/751 |
| 6,953,746 B2 * | 10/2005 | Uesawa | ..................... | 438/640 |
| 7,163,890 B2 * | 1/2007 | Kang et al. | ................. | 438/638 |

FOREIGN PATENT DOCUMENTS

| | | |
|---|---|---|
| KR | 10-1991-0016531 | 10/1994 |
| KR | 10-2001-0089305 | 7/2003 |

* cited by examiner

*Primary Examiner*—Phat X Cao
(74) *Attorney, Agent, or Firm*—Saliwanchik, Lloyd & Saliwanchik

(57) ABSTRACT

A semiconductor device and a method for manufacturing the same is provided. The semiconductor device includes a semiconductor substrate having a conductive layer; an interlayer dielectric layer formed on the semiconductor substrate, the interlayer dielectric layer having a hole with a taper angled at the hole's upper portion; a diffusion barrier layer formed on the hole and the interlayer dielectric layer; and a seed layer formed on the diffusion barrier layer.

9 Claims, 7 Drawing Sheets

SEMICONDUCTOR DEVICE AND METHOD FOR MANUFACTURING THE SAME

RELATED APPLICATION(S)

This application claims the benefit under 35 USC §119(e) of Korean Patent Application No. 10-2005-0129865 filed Dec. 26, 2005, which is incorporated herein by reference in its entirety.

FIELD OF INVENTION

The present invention relates to a semiconductor device and a method for manufacturing the same.

BACKGROUND OF THE INVENTION

In general, there has been a rapid change toward high performance in next generation semiconductor devices. As a result, a via hole size has become reduced and the aspect ratio thereof has become increased. Thus, superior step coverage, via filling capability and high speed operation of a device has become necessary. To this end, a method for forming a metal interconnection on a damascene pattern using copper has been suggested as a useful method. As an example of conventional methods for forming copper interconnection, there is a method including the steps of forming a diffusion barrier layer and a seed layer for forming copper through physical vapor deposition, forming a copper interconnection layer on the seed layer through electroplating to fill a via with the copper interconnection, and performing chemical mechanical polishing. FIGS. 1 to 3 are sectional views representing a method for forming a metal interconnection of a semiconductor device according to the related art.

First, referring to FIG. 1, after an interlayer dielectric layer 30 is formed on a semiconductor substrate 10 having a conductive layer 20 thereon, a hole 40 is formed by partially etching the interlayer dielectric layer 30.

Then, referring to FIG. 2, a diffusion barrier layer 50 and a seed layer 60 including copper are sequentially stacked in the hole 40 and on the surface of the interlayer dielectric layer 30.

In detail, the seed layer 60 and the diffusion barrier layer 50 are formed through a PVD (Plasma Vapor Deposition) process. However, a reduction of the via size and an increase of the step difference may cause a poor step coverage, so that overhang A or a deposition discontinuous point B may occur.

Referring to FIG. 3, a copper interconnection layer 70 is deposited on the seed layer 60 through electroplating so as to fill the hole 40.

However, a void C is formed in the hole 40 due to the overhang A and the deposition discontinuous point B. As described above, according to the related art, the overhang, the deposition discontinuous point and voids cause the increase of the contact resistance so that the reliability of the semiconductor device is reduced.

Further, according to the related art, such overhang, deposition discontinuous point and voids may become serious problems because the aspect ratio of the hole may increase as the degree of integration of the semiconductor device increases.

BRIEF SUMMARY

Embodiments of the present invention can solve the above problems occurring in the prior art. An embodiment of the present invention can provide a semiconductor device and a method for manufacturing the same, capable of preventing an overhang or a void from being generated due to a step difference in the process of forming a diffusion barrier layer and a seed layer.

Another embodiment of the present invention is to provide a semiconductor device and a method for manufacturing the same, capable of preventing the performance degradation of the semiconductor device caused by an overhang or a void, thereby preventing the reliability of the semiconductor device from being degraded.

To achieve the above, embodiments of the present invention provide a semiconductor device comprising: a semiconductor substrate having a conductive layer; an interlayer dielectric layer formed on the semiconductor substrate and provided with a hole having a tapered angle on the upper portion; a diffusion barrier layer formed on the hole and the interlayer dielectric layer; and a seed layer formed on the diffusion barrier layer.

Another aspect of the present invention provides a method comprising: forming an interlayer dielectric layer on the semiconductor substrate having a conductive layer; forming a first photoresist layer having a predetermined thickness on the interlayer dielectric layer; exposing an entire surface of the first photoresist layer; forming a shielding layer on the exposed first photoresist layer; forming and patterning a second photoresist layer on the shielding layer; etching the shielding layer exposed by the patterned second photoresist layer; developing and removing a predetermined portion of the first photoresist layer which is exposed by the etched shielding layer; and forming a hole by etching the interlayer dielectric layer exposed by the removal of the predetermined portion of the first photoresist layer.

DETAILED DESCRIPTION OF THE INVENTION

Hereinafter, a semiconductor device and a method for manufacturing the same according to an exemplary embodiment of the present invention will be explained in detail with reference to accompanying drawings.

In the following description, the expression "formed on each layer" may include the meaning of both "formed directly on each layer" and "formed indirectly on each layer".

FIGS. 4 to 12 illustrate a method for forming a metal interconnection of a semiconductor device in accordance with an exemplary embodiment of the present invention.

Figure 1:
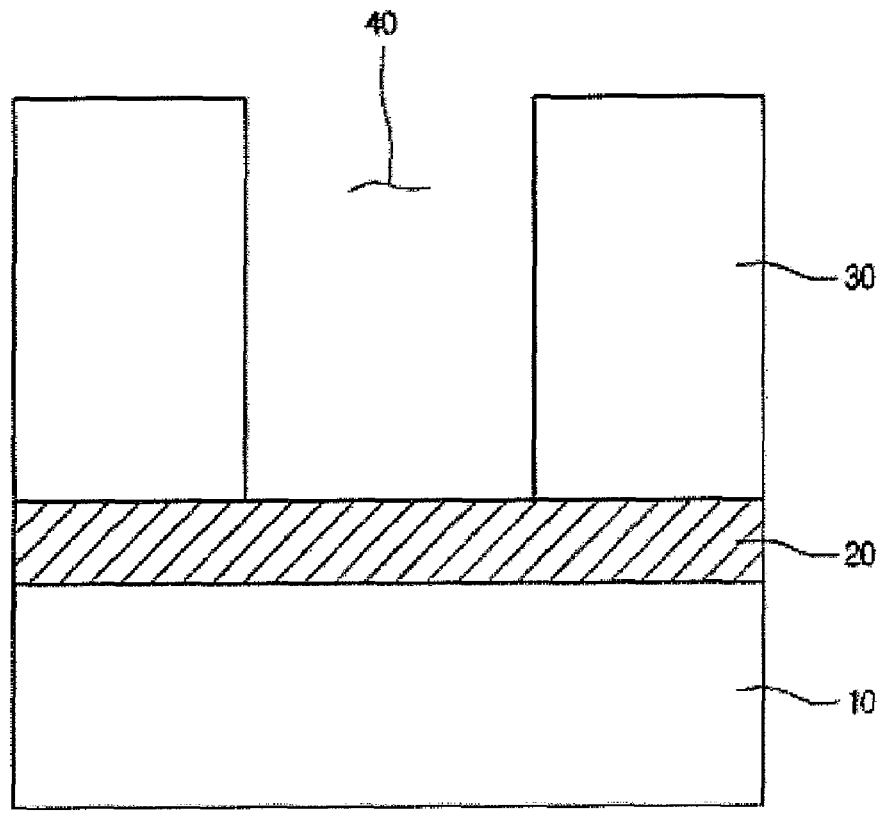
FIGS. 1 to 3 are sectional views illustrating a method for forming a metal interconnection of a semiconductor device according to the related art.
Figure 2:
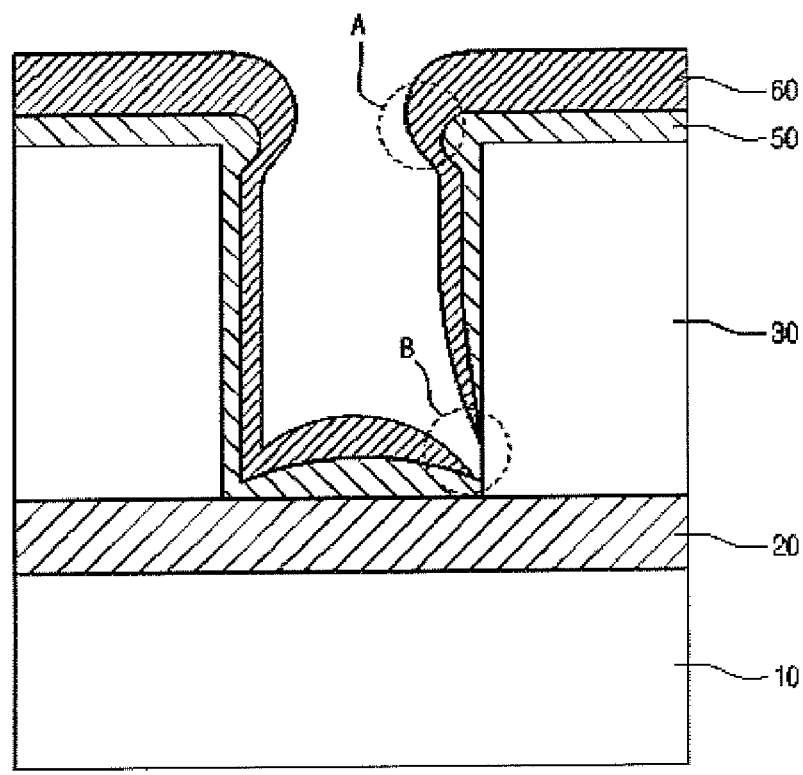
Figure 3:
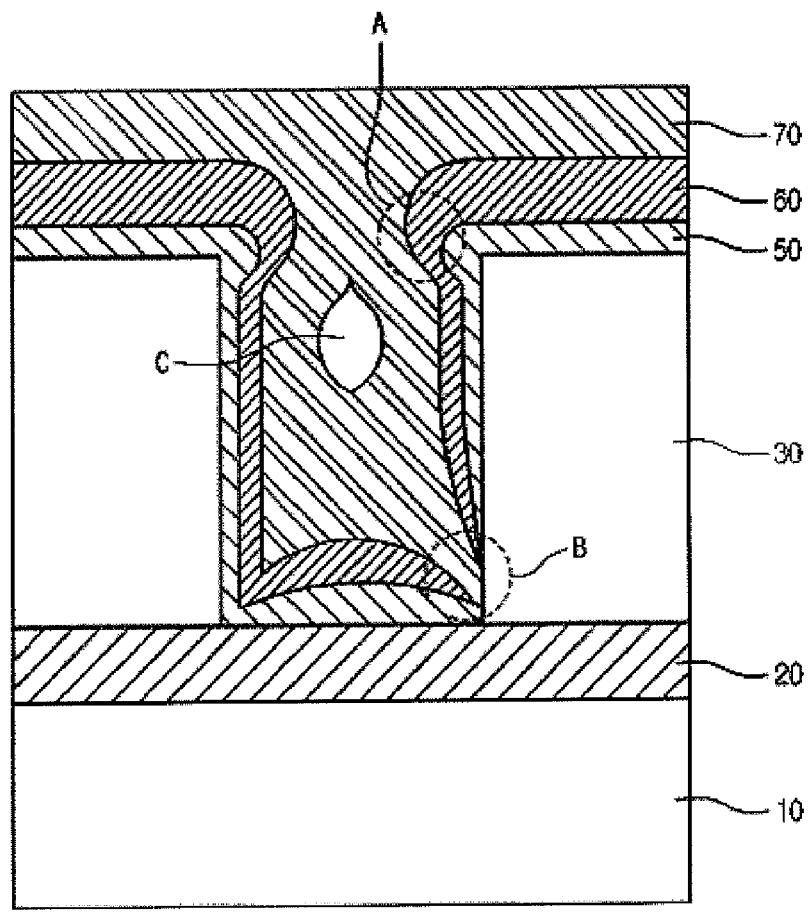
Figure 4:
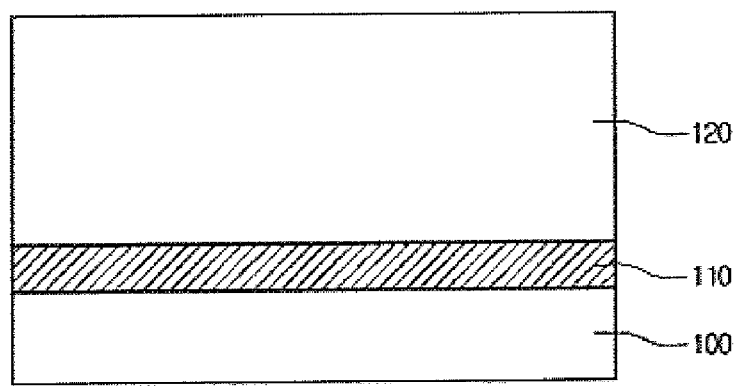
FIGS. 4 to 12 are sectional views illustrating a method for manufacturing a semiconductor device according to an exemplary embodiment of the present invention.

Referring to FIG. 4, an interlayer dielectric layer 120 is formed on a semiconductor substrate 100 where a conductive layer 110 is formed.

Figure 5:
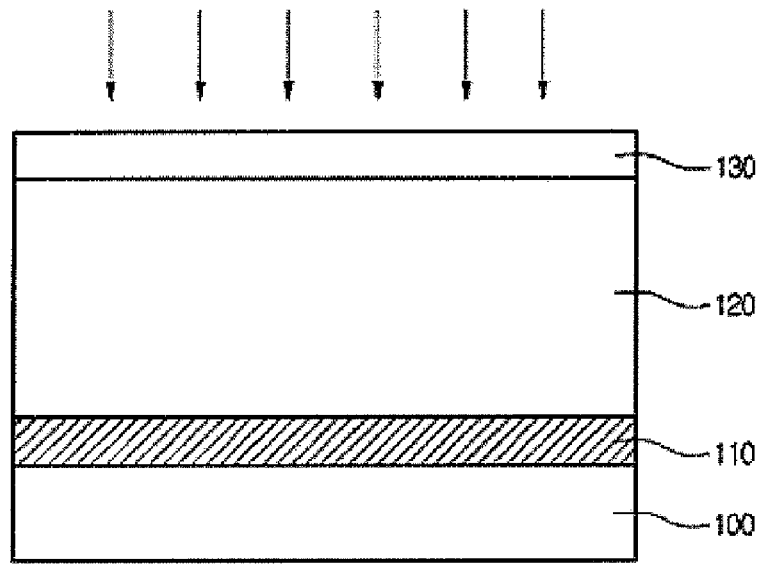

Then, referring to FIG. 5, a photoresist is coated on the interlayer dielectric layer 120 to a predetermined thickness so as to form a first photoresist layer 130. The first photoresist layer 130 can have a thickness such that the width of the undercut portion can be controlled.

In a specific embodiment, the first photoresist layer 130 can have a thickness within a range of about 50 nm to about 200 nm. That is, when the thickness of the first photoresist layer 130 is less than 50 nm, an undercut hardly occurs, and when the thickness of the first photoresist layer 130 exceeds 200 mm, the undercut excessively occurs so that a taper angle of the interlayer dielectric layer 120 is excessively increased.

For instance, according to an embodiment of the present embodiment, an undercut having a proper size may be obtained by forming the first photoresist layer 130 with a thickness of about 100 nm.

Subsequently, a blank exposure process can be performed to expose the entire surface of the first photoresist layer 130 to light without using a photo mask.

Figure 6:
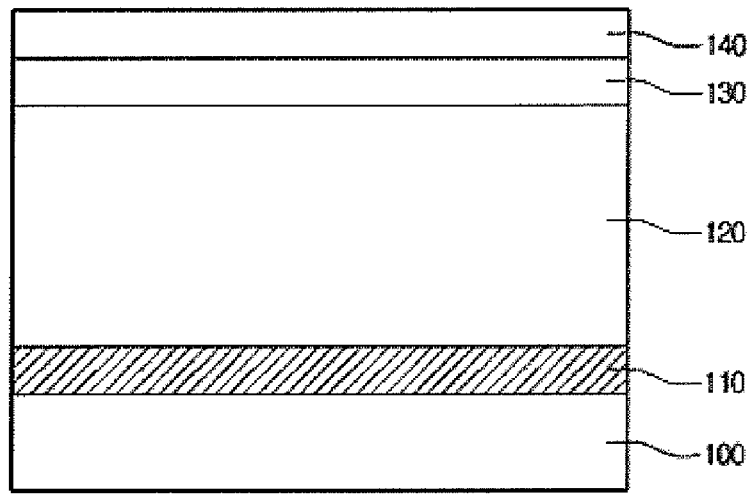

Then, referring to FIG. 6, a shielding layer 140 can be formed on the first photoresist layer 130.

The shielding layer 140 functions to protect the first photoresist layer 130 except for the regions of the first photoresist layer 130 exposed in a subsequent process from making contact with a developer.

In one embodiment a middle metal layer formed by depositing a metal can be used as the shielding layer 140. However, the present invention is not limited thereto. That is, in other embodiments, an insulating layer such as an oxide layer or a nitride layer can be used as the shielding layer 140.

The middle metal layer 140 can be deposited through PVD (Physical Vapor Deposition) or CVD (Chemical Vapor Deposition).

In a specific embodiment, the middle metal layer 140 can be aluminum deposited on the first photoresist layer 130 through CVD.

The middle metal layer 140 can support a second photoresist layer 150, described below, and serves as a mask when removing the first photoresist layer 130.

Figure 7:
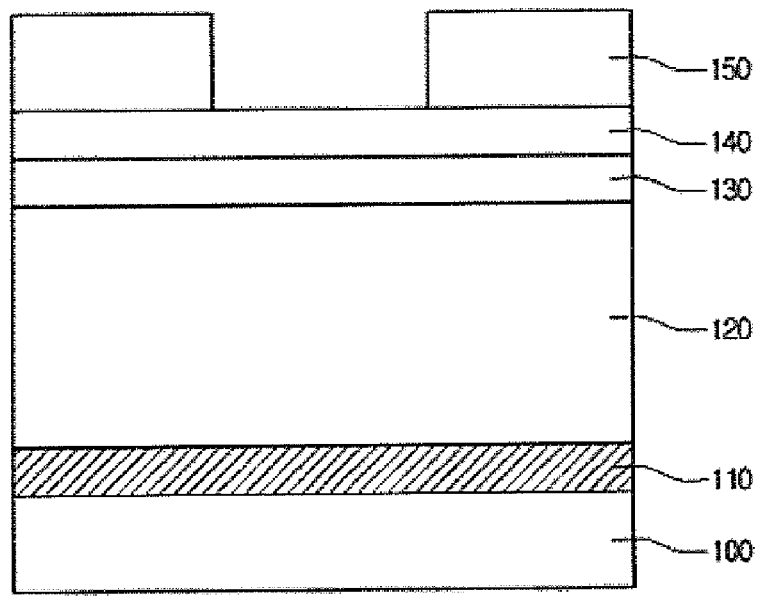

Referring to FIG. 7, a second photoresist layer 150 can be formed on the middle metal layer 140 and patterned for forming a trench.

For example, the second photoresist layer 150 can be exposed to light through a predetermined photo mask so that the second photoresist layer 150 is patterned on the middle metal layer 140. Accordingly, a predetermined portion of the middle metal layer 140 is exposed.

Figure 8:
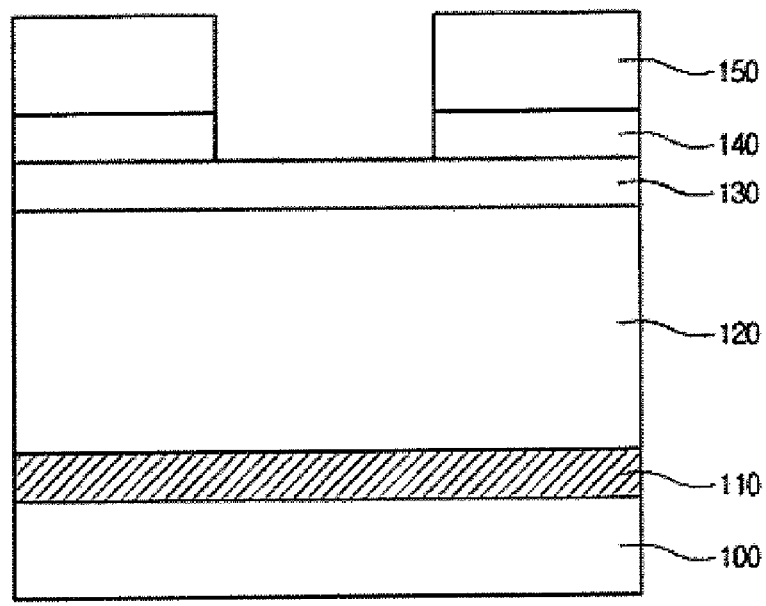

Then, referring to FIG. 8, the exposed middle metal layer 140 can be etched so that a predetermined portion of the first photoresist layer 130 is exposed.

In this case, a wet etching process or a dry etching process can be used as a method for etching the middle metal layer 140.

In one embodiment, the exposed middle metal layer 140 can be etched through RIE (Reactive Ion Etch).

A predetermined portion of the first photoresist layer 130 positioned under the middle metal layer 140 is exposed as the predetermined portion of the middle metal layer 140 is removed.

Figure 9:
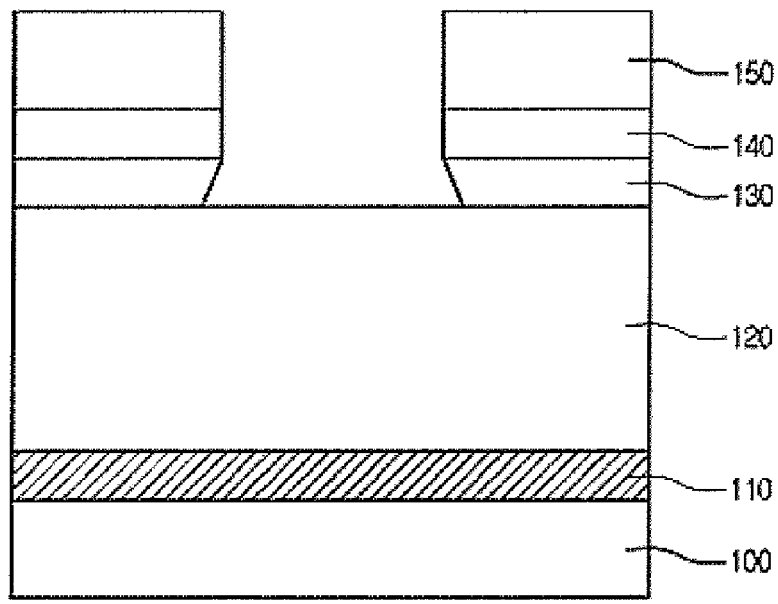

Then, referring to FIG. 9, the exposed first photoresist layer 130 can be developed.

Since the first photoresist layer 130 is blank-exposed in the previous process, the undercut, which is sunk in at a predetermined angle and removed, may occur as the exposed portion of the first photoresist layer 130 is developed.

As the first photoresist layer 130 has been partially undercut, overhang can be prevented from being generated in the following process of forming the diffusion barrier layer 170 and the seed layer 180.

Figure 10:
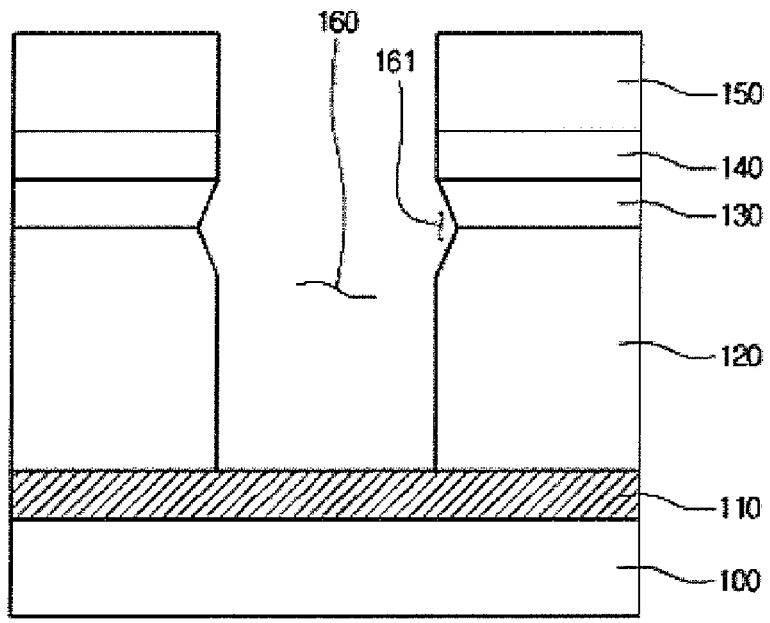

Referring to FIG. 10, as the exposed portion of the first photoresist layer 130 is removed, a predetermined portion of the interlayer dielectric layer 120 can be exposed. The exposed portion of the interlayer dielectric layer 120 can be etched so as to form a hole 160 for the interconnection between layers. Accordingly, a predetermined portion of the conductive layer 110 is exposed.

The hole 160 can be formed as a trench, a via hole or a contact hole depending on the desired application.

In an embodiment, a wet etching process or a dry etching process can be used for etching the interlayer dielectric layer 120. The interlayer dielectric layer 120 can be etched such that the hole 160 is formed therein, and the upper portion thereof is sunk at a predetermined angle.

In this case, the upper portion of the hole 160 has a width wider than the width of the lower portion of the hole 160.

If the interlayer dielectric layer 120 is etched through the dry etching process, the lower portion of the hole 160 can have a width identical to a width of a middle portion of the hole 160, and the upper portion of the hole can have a width wider than the width of the lower portion of the hole.

That is, according to the exemplary embodiment of the present invention, since the lower portion of the first photoresist layer 130 formed on the interlayer dielectric layer 120 is undercut to be sunk at a predetermined angle, the etching rate may increase at the upper portion of the interlayer dielectric layer 120. Accordingly, after the etching process has been performed, the hole 160 is formed in the interlayer dielectric layer 120 and the upper portion of the interlayer dielectric layer 120 is sunk at a predetermined angle.

The upper portion of the interlayer dielectric layer 120 and the lower portion of the first photoresist layer 130, being sunk in at predetermined angles, form sink parts 161.

Figure 11:
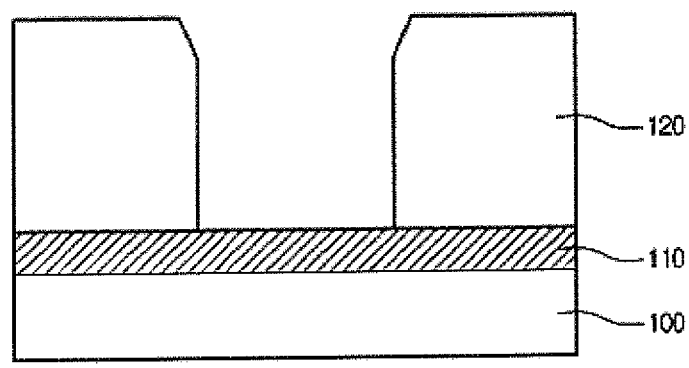

Referring to FIG. 11, the first photoresist layer 130, the middle metal layer 140 and the second photoresist layer 150 can be removed leaving a hole 160 in the interlayer dielectric layer 120 having a tapered angle at the upper portion of the hole 160.

Figure 12:
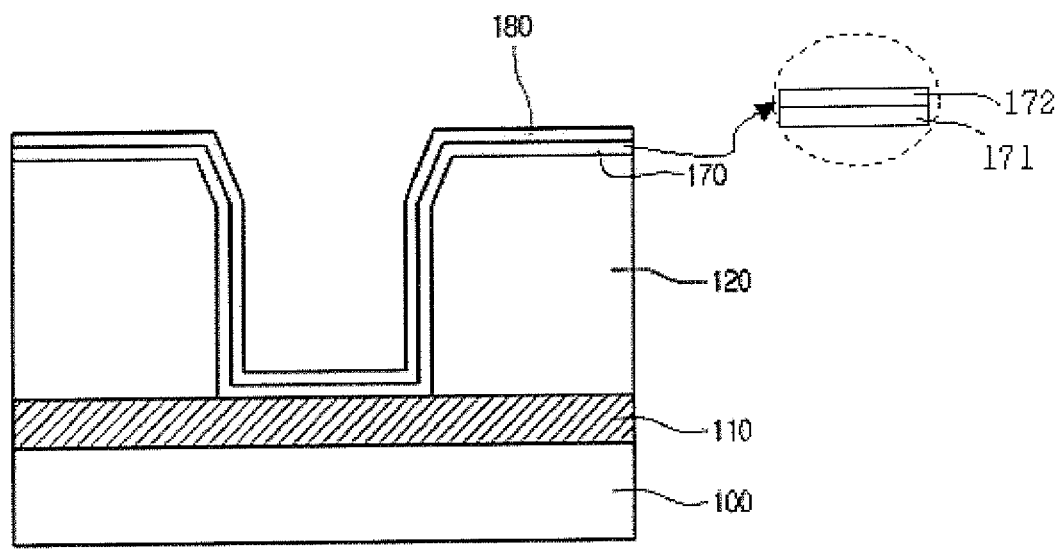

Referring to FIG. 12, a diffusion barrier layer 170 and a seed layer 180 can be sequentially stacked on the interlayer dielectric layer 120.

The diffusion barrier layer 170 prevents a metal interconnection layer to be filled in the hole in the following process from diffusing into the interlayer dielectric layer 120, and the seed layer 180 accelerates the growth of the metal interconnection layer.

In detail, the diffusion barrier layer 170 can be formed on the interlayer dielectric layer 120 and the exposed portion of the conductive layer 110, and the seed layer 180 can be formed on the diffusion barrier layer 170.

The diffusion barrier layer 170 may be formed of a single TaN layer, a single Ta layer, or a dual TaN/Ta layer.

Referring to FIG. 12, the diffusion barrier layer 170 may include a dual layer of TaN/Ta 171 and 172.

Since the upper portion of the interlayer dielectric layer 120 is chamfered at a predetermined angle, the diffusion barrier layer 170 and the seed layer formed on the interlayer dielectric layer 120 are also chamfered at a predetermined angle.

Accordingly, the overhang does not occur in the process of forming the diffusion barrier layer 170 and the seed layer 180 so a void which may generate in the metal interconnection layer to be filled in the hole 160 can be prevented. After forming the diffusion barrier layer 170 and the seed layer 180, a process of forming the metal interconnection layer can be performed to interconnect the layers.

Embodiments of the present invention can be applied to both single damascene process and dual damascene process, and can be applied to the process for forming the contact hole and the via hole.

The semiconductor device and the method for manufacturing the same according to the exemplary embodiment of the present invention can prevent an overhang from being generated due to a step difference of a hole in the process of forming a diffusion barrier layer and a seed layer.

Further, according to embodiments of the present invention, the performance degradation of the semiconductor device caused by an overhang or a void can be prevented, so that the reliability of the semiconductor device can be improved.

The embodiments and the accompanying drawings illustrated and described herein are intended to not limit the present invention, and it will be obvious to those skilled in the art that various changes, variations and modifications can be made to the present invention without departing from the technical spirit of the invention.

I claim:

1. A method for manufacturing semiconductor device, comprising:

forming an interlayer dielectric layer on a semiconductor substrate having a conductive layer;

forming a first photoresist layer having a predetermined thickness on the interlayer dielectric layer;

exposing an entire surface of the first photoresist layer;

forming a shielding layer on the exposed first photoresist layer;

forming a second photoresist layer on the shielding layer and patterning the second photoresist layer to expose a portion of the shielding layer;

etching the exposed portion of the shielding layer using the second photoresist layer as a mask;

developing and removing a predetermined portion of the first photoresist layer exposed by the etched shielding layer;

etching a predetermined portion of the interlayer dielectric layer exposed by the removing of the predetermined portion of the first photoresist layer to form a hole;

sequentially removing the second photoresist layer, shielding layer and the first photoresist layer after forming the hole;

forming a diffusion barrier layer on the hole and the interlayer dielectric layer after removing the second photoresist layer, shielding layer and the first photoresist layer; and forming a seed layer on the diffusion barrier layer, wherein developing and removing a predetermined portion of the first photoresist layer forms an undercut at lower portions of the first photoresist layer.

2. The method of claim 1, wherein exposing an entire surface of the first photoresist layer comprises performing a blank exposure process without using a photo mask.

3. The method of claim 1, wherein etching a predetermined portion of the interlayer dielectric layer to form the hole forms a tapered angle at an upper portion of the interlayer dielectric layer.

4. The method of claim 1, wherein etching a predetermined portion of the interlayer dielectric layer to form the hole forms an tipper portion of the interlayer dielectric layer having a width wider than a width of the hole.

5. The method of claim 1, wherein the shielding layer is formed by depositing a metal layer.

6. The method of claim 1, wherein the shielding layer is formed by depositing an insulating layer.

7. The method of claim 1, wherein the shielding layer is etched and is partially removed by RIE (Reactive Ion Etch).

8. The method of claim 1, wherein the first photoresist layer has a thickness within a range of about 50 nm to about 200 nm.

9. The method of claim 1, wherein the diffusion barrier layer is selected from the group consisting of a single TaN layer, a single Ta layer, and a dual TaN/Ta layer.

* * * * *